United States Patent [19]

Iyer et al.

[11] Patent Number: 4,738,624
[45] Date of Patent: Apr. 19, 1988

[54] BIPOLAR TRANSISTOR STRUCTURE WITH SELF-ALIGNED DEVICE AND ISOLATION AND FABRICATION PROCESS THEREFOR

[75] Inventors: Subramanian S. Iyer; Johannes M. C. Stork, both of Yorktown Heights, N.Y.

[73] Assignee: International Business Machines Corporation, Armonk, N.Y.

[21] Appl. No.: 37,916

[22] Filed: Apr. 13, 1987

[51] Int. Cl.⁴ .................. H01L 21/203; H01L 21/283
[52] U.S. Cl. ........................... 437/67; 437/33; 437/203; 437/200; 437/192; 437/225; 437/105; 437/106; 357/34; 357/71; 148/DIG. 11
[58] Field of Search ........................ 437/31, 32, 33, 67, 437/68, 203, 200, 192, 189, 105, 106, 225; 357/34, 71; 148/DIG. 10, DIG. 11; 156/653, 657

[56] References Cited

U.S. PATENT DOCUMENTS

| | | | |
|---|---|---|---|
| T104,102 | 4/1984 | Ho et al. ............................. | 357/50 |
| 4,135,954 | 1/1979 | Chang et al. ....................... | 437/31 |
| 4,252,582 | 2/1981 | Anantha et al. ................... | 148/175 |
| 4,333,794 | 6/1982 | Beyer ................................... | 437/33 |
| 4,378,630 | 4/1983 | Horng et al. ....................... | 29/580 |
| 4,392,149 | 7/1983 | Horng et al. ....................... | 357/49 |
| 4,428,111 | 1/1984 | Swartz ................................. | 29/576 |
| 4,433,470 | 2/1984 | Kameyama et al. ............... | 29/577 |
| 4,508,579 | 4/1985 | Goth et al. .......................... | 148/175 |
| 4,521,952 | 6/1985 | Riseman .............................. | 29/590 |
| 4,571,817 | 2/1986 | Birritella et al. .................. | 29/576 |
| 4,572,765 | 2/1986 | Berry ................................... | 156/643 |
| 4,586,968 | 5/1986 | Coello-Vera ........................ | 148/188 |
| 4,593,305 | 6/1986 | Kurata et al. ...................... | 437/31 |
| 4,617,724 | 10/1986 | Yokoyama et al. ............... | 437/31 |
| 4,696,097 | 9/1987 | McLaughlin et al. ............. | 437/193 |

FOREIGN PATENT DOCUMENTS 2549293A  1/1985  France .

OTHER PUBLICATIONS

IBM Technical Disclosure Bulletin, vol. 27, No. 2, Jul. 1984, J. F. Shepard "Self-Aligned Bipolar Transistor" p. 1008.

Primary Examiner—Brian E. Hearn
Assistant Examiner—Kevin McAndrews
Attorney, Agent, or Firm—John J. Goodwin

[57] ABSTRACT

A process for fabricating a bipolar transistor structure having device and isolation regions fully self-aligned. The transistor is fabricated using a process wherein collector base and emitter layers are sequentially formed on a semiconductor substrate by a molecular beam epitaxy technique. The emitter layer is covered by insulation layers and a photoresist layer is then formed on the insulation layer. The photoresist layer is masked, exposed and developed to provide a pattern which is used as an etch mask to form both the device emitter area and isolation areas. The isolation areas, the emitter region and the base and collector regions are therefore formed.

8 Claims, 4 Drawing Sheets

BIPOLAR TRANSISTOR STRUCTURE WITH SELF-ALIGNED DEVICE AND ISOLATION AND FABRICATION PROCESS THEREFOR

BACKGROUND OF THE INVENTION

1. Field of the Invention

This invention relates to high performance densely packed bipolar transistors with minimum spacing and a fabrication process therefor using one masking step for self-aligning the device with the isolation area and employing molecular-beam-epitaxy crystal growth techniques.

2. Background Art

U.S. Pat. No. 4,428,111, issued Jan. 31, 1984 to Swartz, entitled MICROWAVE TRANSISTOR, is of interest because it relates to a method using molecular-beam-epitaxy. In the patent, a process for fabricating a high speed bipolar transistor is described wherein the collector, base and emitter layers are first grown using molecular-beam-epitaxy (MBE). A mesa etch is performed to isolate a base-emitter region, and a contact layer is grown using MBE over this isolated region to make contact with the thin base layer. The contact layer is selectively etched to expose the emitter layer, and metal is deposited to fabricate emitter, base and collector contacts.

In U.S. Pat. No. 4,571,817, issued Feb. 25, 1986 to Birritella et al, entitled "METHOD OF MAKING CLOSELY SPACED CONTACTS TO PN-JUNCTION USING STACKED POLYSILICON LAYERS, DIFFERENTIAL ETCHING AND ION IMPLANTATIONS", a means and method is described for forming closely spaced contacts to adjacent semiconductor regions, such as the base and emitter of a bipolar transistor, so that the lateral voltage drops between the contacts and an intervening junction are minimized. The emitter and base and the contacts thereto are self-aligned. This is accomplished by a structure utilizing two poly-layers separated by one or more intermediate dielectric layers. The upper of the two poly-layers serves as a selective etching mask for defining the contact geometry and separation. The lower of the two poly-layers has one portion which becomes a poly-contact and diffusion source for the base region and a second portion which becomes a poly-contact and diffusion source for the emitter region. A single mask is used in connection with ion bombardment to alter the etch rate of portions of the poly-layers. This mask together with subsequent etch steps defines the emitter width and location and the base-emitter contact separation. The process is self-aligning.

The following references are of interest because they show a sidewall method during bipolar manufacture.

U.S. Pat. No. 4,586,968, issued May 6, 1986 to Coello-Vera, entitled PROCESS OF MANUFACTURING A HIGH FREQUENCY BIPOLAR TRANSISTOR UTILIZING DOPED SILICIDE WITH SELF-ALIGNED MASKING discloses a transistor which includes base fingers, a titanium silicide coating, from which the base diffusions have been formed, and a silicon nitride coating.

The edges of sandwiches made up of bands are bordered by a silica bank formed automatically by deposit and anisotropic attack, without additional masking. Emitter fingers are overhung by a polycrystalline silicon layer from which doping of these fingers has been obtained.

The possibility is also obtained, automatically and without masks alignment, of having the emitter and base fingers brought firmly together with minimum protection distances.

FR No. 2549-293-A, dated Jan. 18, 1985, describes a transistor that consists of a semiconductor wafer with zones of alternate conduction type forming fingers in its surface for the emitter and base. The base finger forms a sandwich with at least a first conducting strip consisting of a metal/silicon compound (esp. titantium silicide) and a second insulating strip. Insulating banks support the side walls of the sandwich and extend far enough to cover the extremities of the base and emitter fingers.

The emitter fingers are covered by at least one conducting layer extending over the two adjacent insulating strips U.S. Defensive Publication No. T104,102, dated Apr. 3. 1984, to Ho et al, entitled POLYSILICON-BASE SELF-ALIGNED BIPOLAR TRANSISTOR PROCESS AND STRUCTURE describes a bipolar transistor isolated by deep recessed oxide with shallow recessed oxide separating the base from collector contact with polysilicon contact to base extrinsic region, the polysilicon being self-aligned with the emitter and the emitter contact.

U.S. Pat. No. 4,521,952, issued June 11, 1985 to Riseman, entitled METHOD OF MAKING INTEGRATED CIRCUITS USING METAL SILICIDE CONTACTS discloses a metal silicide contact to silicon devices which has broad application to almost all of the variety of silicon semiconductor devices is described. This contact with a substantial side component has particular advantage as the base contact for a bipolar transistor.

The publication by Shepard entitled SELF-ALIGNED BIPOLAR TRANSISTOR, IBM Technical Disclosure Bulletin, Vol. 27, No. 2, July 1984, pp. 1008–1009, also describes a bipolar transistor side wall structure.

The following references are typical of the present state of the transistor process art.

U.S. Pat. No. 4,508,579, issued Apr. 2, 1985 to Goth et al, entitled LATERAL DEVICE STRUCTURES USING SELF-ALIGNED FABRICATION TECHNIQUES.

U.S. Pat. No. 4,572,765, issued Feb. 25, 1986 to Berry, entitled METHOD OF FABRICATING INTEGRATED CIRCUIT STRUCTURES USING REPLICA PATTERNING.

U.S. Pat. No. 4,433,470, issued Feb. 28, 1984 to Kameyama et al, entitled METHOD FOR MANUFACTURING SEMICONDUCTOR DEVICE UTILIZING SELECTIVE ETCHING AND DIFFUSION.

U.S. Pat. No. 4,252,582, issued Feb. 24, 1981 to Anantha et al, entitled SELF ALIGNED METHOD FOR MAKING BIPOLAR TRANSISTOR HAVING MINIMUM BASE TO EMITTER CONTACT SPACING.

U.S. Pat. No. 4,378,630, issued Apr. 5, 1983 to Horng et al, entitled PROCESS FOR FABRICATING A HIGH PERFORMANCE PNP AND NPN STRUCTURE.

U.S. Pat. No. 4,392,149, issued July 5, 1983 to Horng et al, entitled BIPOLAR TRANSISTOR.

SUMMARY OF THE INVENTION

An object of the present invention is to provide an improved bipolar transistor structure having a narrow base width.

Another object of the present invention is to provide an improved bipolar transistor having collector, base and emitter layers grown on a semiconductor substrate by molecular-beam-epitaxy.

A further object of the present invention is to provide an improved bipolar transistor wherein the emitter area and the isolation area are defined in one masking step resulting in full self-alignment.

DISCLOSURE OF THE INVENTION

Figure 1:
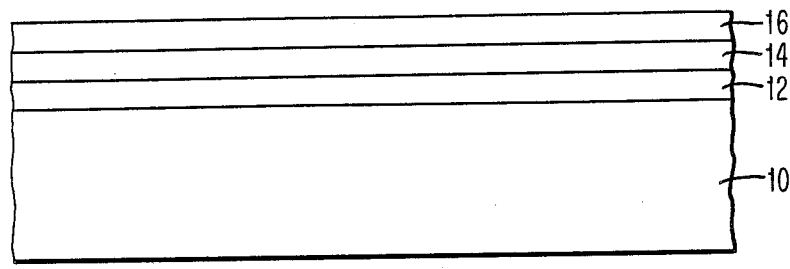
FIGS. 1 through 7 are cross-sectional schematic illustrations of the fabrication steps and structure of a bipolar transistor according to the present invention.

Referring to FIG. 1, a cross-sectional schematic illustration of the structure employed at the beginning of the subject fabrication process is shown including a semiconductor substrate 10 which, for purposes of explanation and example, is selected to be p-type single crystal silicon. Then thin device layers including an n+/n collector layer 12, a p+ base layer 14 and n+/n emitter layer 16 are formed by molecular-beam-epitaxial (MBE) growth using known state-of-the-art MBE techniques.

Figure 2:
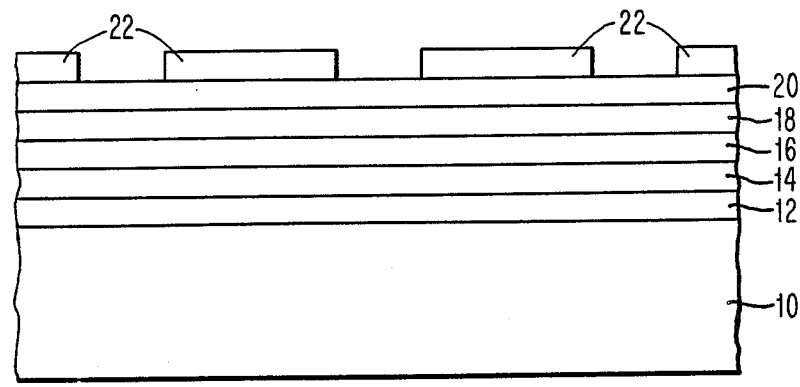
Figure 3:
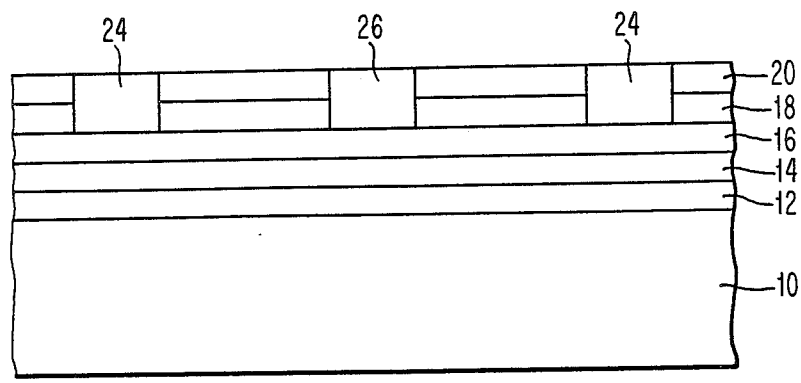

Next, a layer of silicon dioxide ($SiO_2$)18, a layer of silicon nitride ($Si_3N_4$)20 and a layer of photoresist material 22 are deposited. The photoresist layer is masked, exposed and developed to form a pattern for the device areas as shown in FIG. 2. The nitride and oxide layers 20 and 18 are etched away using the patterned photoresist as a mask to form isolation areas 24 and emitter area 26 which are then filled with a tungsten-tungsten silicide-tungsten stack by deposition as shown in FIG. 3.

Figure 4:
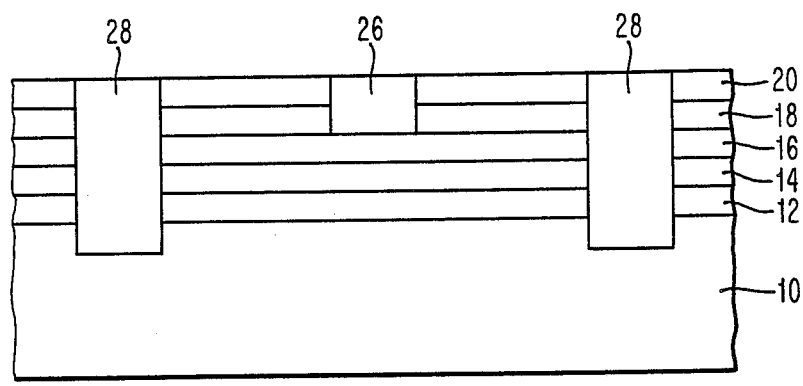

Using a block-out mask, an etch step is performed to remove the tungsten and tungsten silicide from the isolation areas 24 and then trenches 28 are formed by conventional etch processes, including channel stop implants, down and into the silicon substrate 10. The trenches 28 are filled with silicon dioxide isolation material and are planarized. This results in an emitter region 26 being self-aligned with isolation regions 28 as illustrated in FIG. 4.

Figure 5:
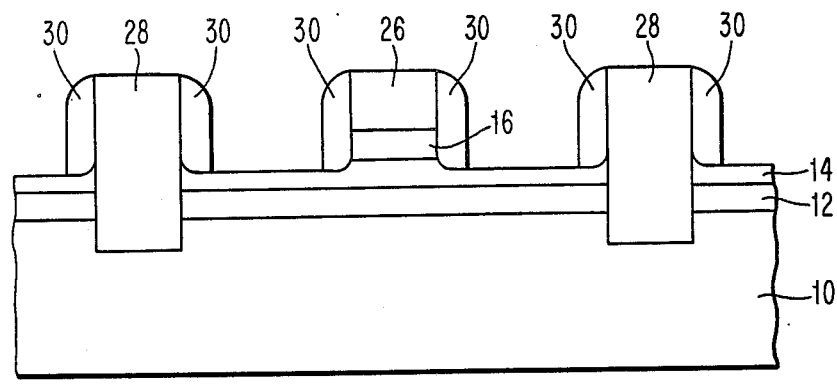

The nitride layer 20 and the oxide layer 18 are then etched away between the emitter area 26 and the isolation areas 28. A dopant-level selective etch is then employed to etch the n+/n emitter layer 16 and down to the p+ base layer 14. Sidewalls 30 are grown from the silicon material 28 as shown in FIG. 5.

Figure 6:
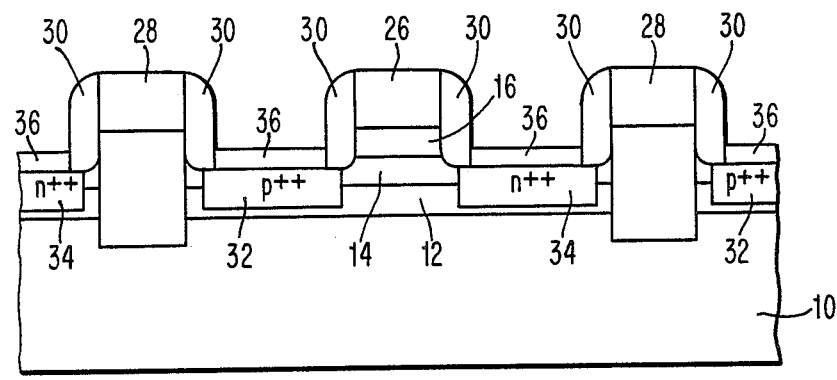

Using implant block-out masks, the extrinsic base areas 32 and extrinsic collector areas 34 are separately formed by implantation and anneal cycles. The base area implantation 32 may be boron or gallium and the collector area implantation 34 may be arsenic or phosphorous. Salicide technology is then used to make base and collector contacts 36 as illustrated in FIG. 6.

Figure 7:
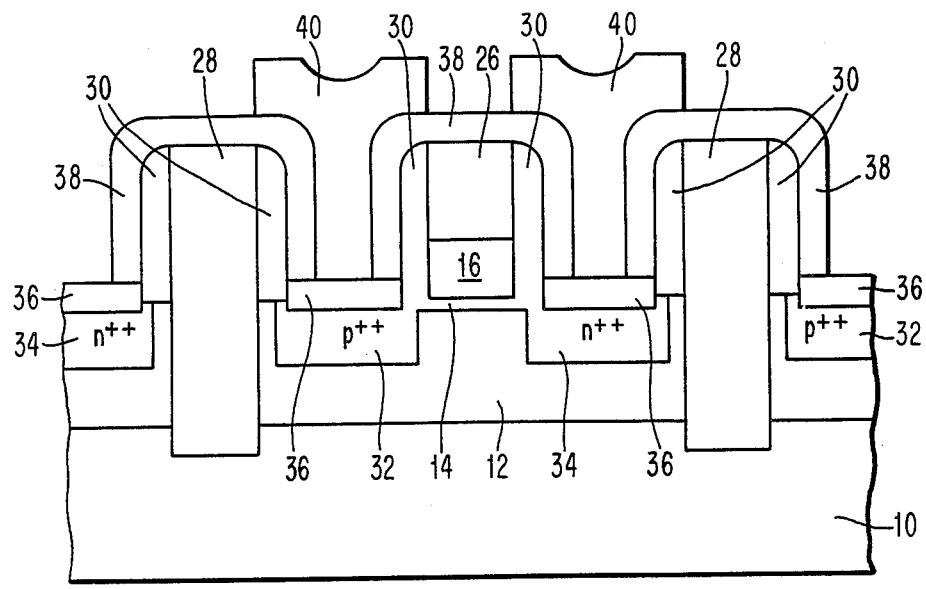

FIG. 7 illustrates a schematic cross section view of the final structure after oxide 38 is formed by chemical vapor deposition, after emitter, base and collector contact windows have been opened and contact metallization 40 and interconnect formed.

Figure 8:
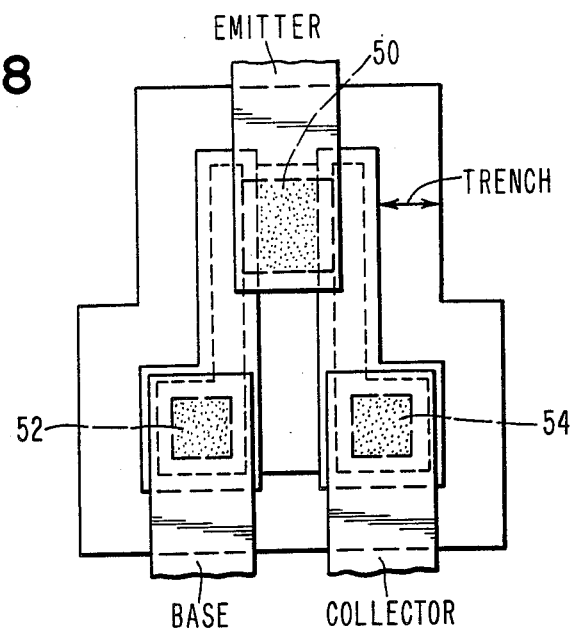

FIG. 8 is a schematic plan view of the spatial relationship of the device including the emitter, base and collector, and their respective contact locations 50, 52 and 54.

Having thus described our invention, what we claim as new, and desire to secure by Letters Patent is:

1. A method for fabricating a bipolar device structure having device and isolation regions fully self-aligned comprising the steps of:

on a substrate of first conductivity type semiconductor material, the step of forming a first layer composed of epitaxial semiconductor material to provide a device collector layer, forming a second layer composed of second conductivity type semiconductor material on said first layer to provide a device base layer, forming a third layer composed of first conductivity type semiconductor material on said second layer to provide a device emitter layer, forming a fourth layer composed of a first type of electrical insulating material on said third layer, forming a fifth layer composed of a second type of electrical insulating material on said fourth layer, forming a sixth layer composed of photoresistive material on said fifth layer, masking, exposing and developing said sixth layer of photoresistive material to form patterned openings in said sixth layer for defining transistor device areas on said fifth layer, using said patterned sixth layer of photoresistive material as an etch mask, etching away corresponding portions of said fourth and fifth layers of insulating material to form trench regions, filling said trench regions with metal and metal silicide material, masking and etching the metal and metal silicide material from selected ones of said trench regions, leaving said metal and metal silicide in an unselected trench region intermediate said selected trench regions from which said metal and metal silicide has been etched away, said unselected trench region being a device emitter region, further etching said selected trench regions through said first, second and third layers and into a portion of said substrate, filling said selected, etched trench regions with electrical insulating material for forming device isolation regions which are self-aligned with said device emitter region, and forming extrinsic base and collector regions between said isolation regions and said emitter region.

2. A method for fabricating a bipolar device structure according to claim 1 wherein said step of forming said base and collector regions includes the steps of:

removing portions of said fourth and fifth layers of insulating material between said isolation regions and said emitter region, removing said third device emitter layer to expose said second device base region except that portion beneath said metal and metal silicide in said emitter region, growing sidewalls of insulating material on the sides of said exposed device isolation regions and on the sides of said metal, metal silicide and said portion of said third layer forming said emitter region, forming base and collector areas in said first and second layers between said emitter region and said isolation regions by doping.

3. A method for fabricating a bipolar device structure according to claim 1 wherein said substrate is composed of p-type single crystal silicon, said first layer is n+/n epitaxial silicon, said second layer is p+ semiconductor material, said third layer is n+/n epitaxial silicon, said fourth layer is silicon dioxide and said fifth layer is silicon nitride.

4. A method for fabricating a bipolar device structure according to claim 3 wherein said base area is formed by boron ion implantation.

5. A method for fabricating a bipolar device structure according to claim 3 wherein said base area is formed by gallium ion implantation.

6. A method for fabricating a bipolar device structure according to claim 3 wherein said collector area is formed by arsenic ion implantation.

7. A method for fabricating a bipolar device structure according to claim 3 wherein said collector area is formed by phosphorous ion implantation.

8. A method for fabricating a bipolar device structure according to claim 3 further including the steps of creating contact openings to said emitter, base and collector regions, and forming a metal layer over said emitter, base and collector regions to serve as contacts.

* * * * *